United States Patent
Wei et al.

(10) Patent No.: US 8,076,778 B2
(45) Date of Patent: Dec. 13, 2011

(54) METHOD FOR PREVENTING AL-CU BOTTOM DAMAGE USING TIN LINER

(75) Inventors: Kuo Liang Wei, Hsinchu (TW); Hsu Sheng Yu, Hsinchu (TW); Hong-Ji Lee, Taoyuan (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 12/570,941

(22) Filed: Sep. 30, 2009

(65) Prior Publication Data
US 2011/0074030 A1 Mar. 31, 2011

(51) Int. Cl.
*H01L 23/48* (2006.01)
*H01L 23/52* (2006.01)
*H01L 23/40* (2006.01)

(52) U.S. Cl. ........ 257/750; 257/635; 257/758; 257/762; 257/765; 257/771; 257/E21.017; 257/E21.02; 257/E21.022; 257/E23.151; 257/E23.155; 257/E23.157; 257/E23.161; 257/E21.582; 257/E21.59; 257/E21.591; 438/618; 438/622; 438/625; 438/628; 438/543; 438/548; 438/652; 438/656; 438/669; 438/688; 216/62; 216/67; 216/72; 216/100; 216/102

(58) Field of Classification Search .................. 257/635, 257/750, 758, 762–765, 771, E21.017, E21.02–E21.022, E23.151, E34.154, E23.155, E23.157–E23.161, E23.175, E21.582–E21.584, E21.59, 257/E21.591; 438/618, 622, 625–628, 543, 438/544, 548, 652–654, 656, 669, 673, 685, 438/687, 688, FOR. 349, FOR. 352, FOR. 354, 438/FOR. 357, FOR. 358; 216/62, 67, 72, 216/75, 77, 78, 100, 102, 105
See application file for complete search history.

(56) References Cited

U.S. PATENT DOCUMENTS

| | | | | |
|---|---|---|---|---|
| 5,578,166 A * | 11/1996 | Hirota | ............................ | 216/67 |
| 5,779,926 A * | 7/1998 | Ma et al. | ......................... | 216/67 |
| 5,976,986 A * | 11/1999 | Naeem et al. | ................ | 438/714 |
| 6,054,380 A * | 4/2000 | Naik | ............................. | 438/624 |
| 6,103,630 A * | 8/2000 | Lee et al. | ...................... | 438/696 |
| 6,156,663 A * | 12/2000 | Watanabe et al. | ............ | 438/695 |
| 6,271,119 B1 * | 8/2001 | Kishimoto | .................... | 438/624 |
| 6,277,745 B1 * | 8/2001 | Liu et al. | ...................... | 438/687 |
| 6,307,266 B1 * | 10/2001 | Yung | ............................. | 257/758 |
| 6,387,820 B1 * | 5/2002 | Sanderfer | ..................... | 438/725 |
| 6,440,865 B1 * | 8/2002 | Lee | ................................ | 438/714 |
| 6,566,263 B1 * | 5/2003 | Hung et al. | ................... | 438/688 |
| 6,617,689 B1 * | 9/2003 | Honeycutt | ................... | 257/750 |
| 6,677,647 B1 * | 1/2004 | Dawson | ........................ | 257/368 |
| 6,821,900 B2 * | 11/2004 | Athavale et al. | ............. | 438/700 |
| 6,960,529 B1 * | 11/2005 | Nelson et al. | ................ | 438/696 |
| 7,078,339 B2 * | 7/2006 | Lee | ................................ | 438/669 |
| 2002/0001945 A1 * | 1/2002 | Song et al. | .................... | 438/656 |
| 2002/0038911 A1 * | 4/2002 | Graas et al. | .................... | 257/763 |

(Continued)

*Primary Examiner* — Meiya Li
(74) *Attorney, Agent, or Firm* — Baker & McKenzie LLP

(57) ABSTRACT

A semiconductor device and related method for fabricating the same include providing a stacked structure including an insulating base layer and lower and upper barrier layers with a conductive layer in between, etching the stacked structure to provide a plurality of conductive columns that each extend from the lower barrier layer, each of the conductive columns having an overlying upper barrier layer cap formed from the etched upper barrier layer, wherein the lower barrier layer is partially etched to provide a land region between each of the conductive lines, forming a liner layer over the etched stacked structure exposing the land region, and etching the liner layer and removing the exposed land region to form a plurality of conductive lines.

16 Claims, 4 Drawing Sheets

U.S. PATENT DOCUMENTS

2003/0036260 A1* 2/2003 Nakamura ................... 438/622
2003/0116826 A1* 6/2003 Hsue et al. ................... 257/650
2006/0214191 A1* 9/2006 Nishimura ................... 257/208
2008/0036026 A1* 2/2008 Park ............................. 257/459

* cited by examiner

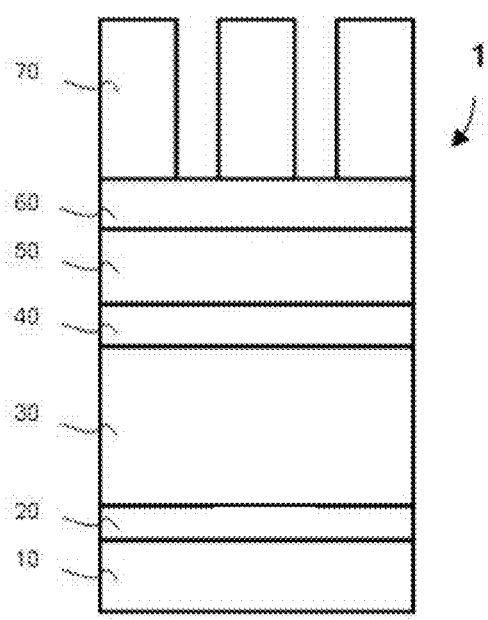
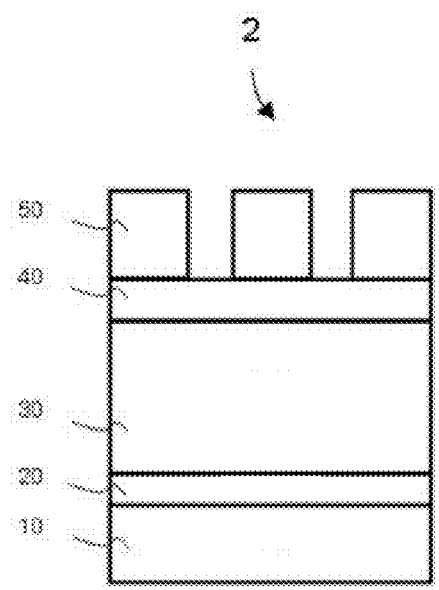
FIG. 1A
(Prior Art)
FIG. 1B
(Prior Art)

METHOD FOR PREVENTING AL-CU BOTTOM DAMAGE USING TIN LINER

BACKGROUND

1. Technical Field

The present invention relates to conductive lines of a semiconductor device, and more particularly, to a method for preventing damage to a conductive line during fabrication of a semiconductor device.

2. Related Art

As sizes of conductive lines of semiconductor devices are designed below sub-micron ranges, such as AlCu at about 0.1 µm, it is difficult to protect sidewalls of metal lines (ML) during fabrication processing. One solution includes using a heavy polymer gas flow during ML etch processing to protect the sidewall of the ML lines against damage. However, this solution results in producing ML lines having wider bottom portions and suffers from a tight overlay window of adjacent ML line formation. Conversely, in an attempt to relieve the overlay window problem, a light polymer gas flow is used to protect the sidewall of the ML lines against etching damage.

FIGS. 1A-1C are schematic cross-sectional views of a conventional method for fabricating conductive lines of a semiconductor device using the light polymer gas flow. In FIG. 1A, a basic stacked structure 1 includes an oxide layer 10, a lower barrier TiN/Ti layer 20, an Al—Cu layer 30, an upper barrier layer TiN/Ti 40, a TEOS layer 50, a bottom antireflective coating layer 60, and a photoresist layer 70. Here, the photoresist layer 70 has been patterned.

In FIG. 1B, the stacked structure 1 (in FIG. 1) is etched and processed, thereby patterning the TEOS layer 50. Accordingly, the stacked structure 1 (in FIG. 1A) is processed to form an etched stacked structure 2.

In FIG. 1C, the etched stacked structure 2 (in FIG. 1B) is dry etched and processed, thereby producing the metal line structure 3. Here, the metal line structure 3 includes a plurality of conductive lines 32 mutually separated by trenches 14 formed through an upper surface of the oxide layer 12, thereby forming lower TiN/Ti barriers 22, the conductive lines 32, the upper TiN/Ti barriers 42, and the TEOS caps 52.

As shown in FIG. 1C, by using the light polymer gas flow during final etch processes, notches 34 are formed around lower portions of the conductive lines 32 during etching of the lower TiN/Ti barrier layer 20 (in FIG. 1B). Accordingly, the conductive lines 32 are significantly damaged. Thus, each of the conductive lines 32 are mechanically weakened at the interface with corresponding ones of the lower TiN/Ti barriers 22.

Thus, a method is required that can prevent notch formation of conductive lines during etching processing, and provide adequate relief of the overlay window.

SUMMARY

A method of fabricating conductive lines of a semiconductor device while preventing damage to the conductive lines is described here.

In one aspect, a method for fabricating a semiconductor device includes providing a stacked structure including an insulating base layer and lower and upper barrier layers with a conductive layer in between, etching the stacked structure to provide a plurality of conductive columns that each extend from the lower barrier layer, each of the conductive columns having an overlying upper barrier layer cap formed from the etched upper barrier layer, wherein the lower barrier layer is partially etched to provide a land region between each of the conductive lines, forming a liner layer over the etched stacked structure exposing the land region, and etching the liner layer and removing the exposed land region to form a plurality of conductive lines.

In another aspect, a method for fabricating a semiconductor device includes etching completely through an upper barrier layer and a conductive layer, without etching completely through a lower barrier layer disposed beneath the conductive layer, to form a plurality of conductive lines extending from the lower barrier layer, forming a liner layer to completely cover the conductive lines and to partially cover portions of the lower barrier layer disposed between the conductive lines, and etching completely through the lower barrier layer after the forming of the liner layer to form a plurality of lower barrier layers, wherein each of the plurality of lower barrier layers correspond to one of the plurality of conductive lines.

These and other features, aspects, and embodiments of the invention are described below in the section entitled "Detailed Description."

BRIEF DESCRIPTION OF THE DRAWINGS

Features, aspects, and embodiments are described in conjunction with the attached drawings, in which:

FIGS. 1A-1C are schematic cross-sectional views of a conventional method for fabricating conductive lines of a semiconductor device using the light polymer gas flow.

DETAILED DESCRIPTION

Figure 1C:
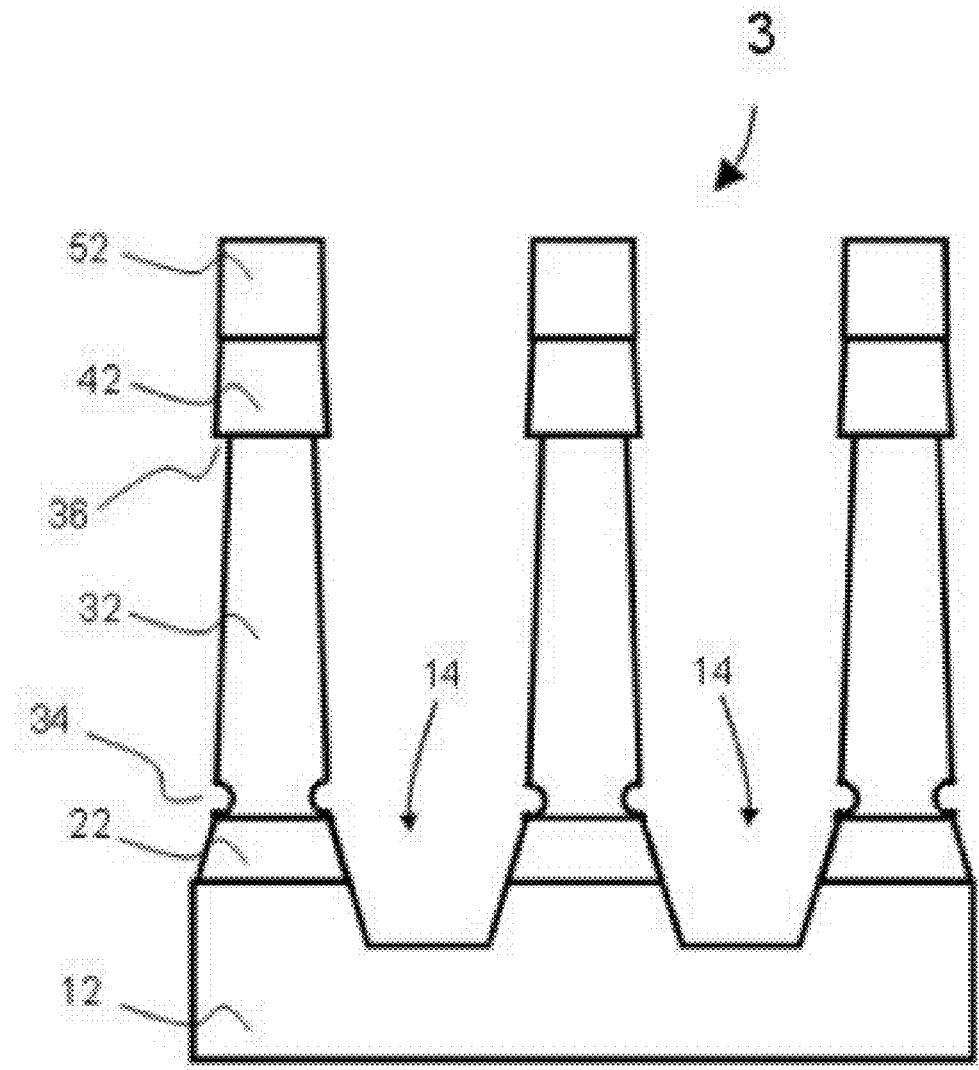
Figure 2A:
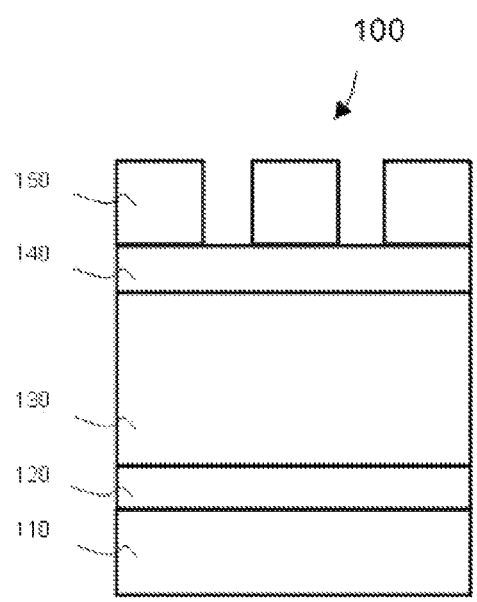
FIGS. 2A-2D are schematic cross-sectional views of an exemplary method for fabricating conductive lines of a semiconductor device according to one embodiment.

FIGS. 2A-2D are schematic cross-sectional views of an exemplary method for fabricating conductive lines of a semiconductor device according to one embodiment. In FIG. 2A, a stacked structure 100 includes a base oxide layer 110, a lower TiN/Ti barrier layer 120, an Al—Cu conductive layer 130, an upper TiN/Ti barrier layer 140, and a patterned TEOS layer 150.

Figure 2B:
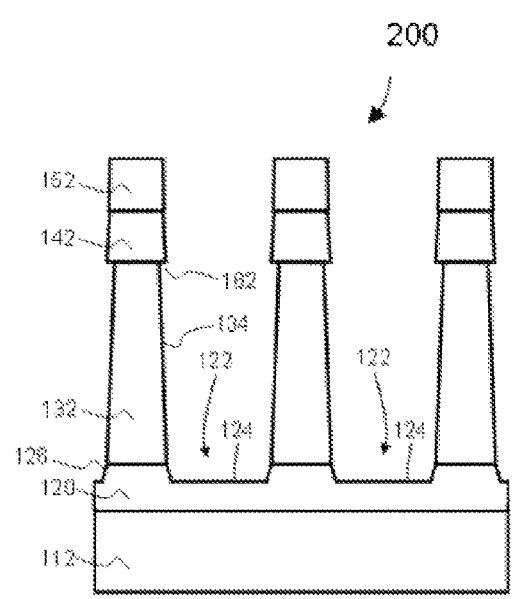

In FIG. 2B, the stacked structure 100 is etched to form a preliminary conductive structure 200. For example, the light polymer gas flow is performed during a plasma etching process to produce the conductive structure 200. Here, the plasma etching process may include a low bias power of about 0~60 W, a $BCl_3$ etchant gas flow of about 0~30 sccm, and a polymer gas flow including $CHF_3$ at about 0-20 sccm and N2 at about 0~20 sccm. Accordingly, the preliminary conductive structure 200 may include a plurality of trenches 122 defining a plurality of conductive columns that include a lower oxide base 112, a patterned lower TiN/Ti barrier layer 120, a plurality of conductive lines 132, a patterned upper TiN/Ti barrier layer 142, and a plurality of TEOS caps 152. Here, as a result of the etching process, the lower TiN/Ti barrier layer 120 is only partially etched to form a plurality of exposed land regions 124 between adjacent ones of the conductive lines 132. In addition, a width of first end portions of the etched sidewalls 134 of the conductive lines 132 are substantially equal to a width of etched sidewalls 126 of the lower TiN/Ti barrier layer 120, and second portions of the etched sidewalls 134 of the conductive lines 132 are undercut at an undercut region 162 with regard to the patterned upper TiN/Ti barrier layer 142 and the TEOS cap 152.

Figures 2C, 2D:
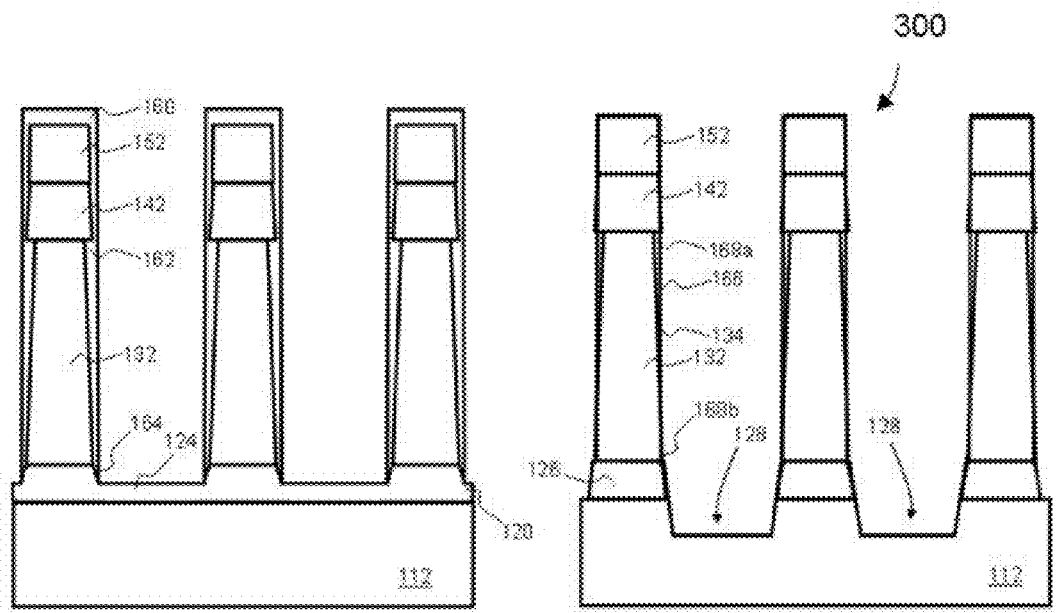

In FIG. 2C, a liner layer 160, such as TiN, is deposited on the conductive structure 200. For example, TiN having a thickness of about 100 Å to about 200 Å may be provided to completely cover the TEOS caps 152, the patterned upper TiN/Ti barrier layers 142, the conductive lines 132, and the etched sidewalls 126 of the lower TiN/Ti barrier layer 120. As shown, the liner layer 160 is conformal to the undercut region 162 and includes a lower portion 164 that terminates at ends of the land regions 124. Accordingly, the liner layer 160 leaves only the land regions 124 of the lower TiN/Ti barrier layer 120 exposed.

In FIG. 2D, a dry plasma etching is performed to produce a conductive line structure 300. Here, the etching removes the land regions 124 (in FIG. 2C) and portions of the oxide layer 112 to provide trenches 128 between each of the conductive lines 132, thereby forming a plurality of lower TiN/Ti barrier layers 126. In addition, the liner layer 160 (in FIG. 2C) is patterned to provide tapered sidewall structures 166 along the sidewalls 134 of the conductive lines 132. Moreover, the tapered sidewall structures 166 of the liner layer 160 (in FIG. 2C) are provided having a first thickness portion 168a adjacent to the undercut region 162 and a second thickness portion 168b adjacent to an interface between the conductive line 132 and the lower TiN/Ti barrier layer 126. For example, the first thickness portion 168a may be substantially aligned with a lower width of the upper TiN/Ti barrier layer 142 and the second thickness portion 168b may be substantially aligned with an upper width of the lower TiN/Ti barrier layer 126. In some circumstances, it may be desirable to form the second thickness portion 168b to be substantially zero, i.e., the tapered sidewall structures 166 may end at the upper width of the lower TiN/Ti barrier layer 126.

As a result, the conductive lines 132 may be provided without having notches formed at the base region of the conductive lines 132. Accordingly, the conductive lines 132 may be provided having improved mechanical strength by preventing formation of notches during final etching of the lower TiN/Ti barrier layer 120, and the overlay window between adjacent ones of the plurality of conductive lines can be relieved.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A semiconductor device, comprising:
a plurality of conductive columns extending from an insulating base layer and each comprising a lower barrier layer on the insulating base layer, a conductive layer on the lower barrier layer, and an overlying upper barrier layer on the conductive layer; and
a plurality of conductive liner layers, wherein both sides of each of the conductive columns are at least partially covered by respective liner layers; wherein each of the liner layers includes a first thickness portion over an undercut region at an interface between the conductive layer of a respective conductive column and the overlying upper barrier layer of the respective conductive column;
wherein each liner layer further includes a second thickness portion substantially adjacent to an interface between the lower barrier layer of the respective conductive column and the conductive layer of the respective conductive column;
wherein the first thickness portion is greater than the second thickness portion.

2. The device method according to claim 1, wherein each of the liner layers includes TiN at a thickness of about 100 Å~200 Å.

3. The device according to claim 1, wherein the lower barrier layers are electrically insulated from each other.

4. The device according to claim 1, wherein the first thickness portion is substantially aligned with a lower width of the upper barrier layer, and the second thickness portion is substantially aligned with an upper width of the lower barrier layer.

5. The device according to claim 1, further comprising a trench in the insulating base layer between the conductive columns.

6. The device according to claim 5, wherein a sidewall of the lower barrier layer and a sidewall of the trench are substantially coplanar.

7. The device according to 1, wherein the conductive layers are tapered.

8. The device according to claim 1, wherein the conductive layers include Al—Cu.

9. The device according to claim 1, wherein the lower and upper barrier layers each includes at least one of TiN and Ti.

10. A semiconductor device, comprising:
a plurality of conductive columns extending from an insulating base layer and each comprising a respective lower barrier layer on the insulating base layer, a respective conductive layer on the respective lower barrier layer, and a respective overlying upper barrier layer on the respective conductive layer, wherein the conductive columns are electrically insulated from each other;
wherein the conductive layer in each of the conductive columns is tapered creating an undercut region at an interface between the conductive layer of each conductive column and the respective overlying upper barrier layer; and
a plurality of conductive liner layers, each respective over portions of a sidewall of the conductive columns, wherein each liner layer includes a first thickness portion over the undercut region, and a second thickness portion substantially adjacent to an interface between the lower barrier layer and the conductive layer; wherein the first thickness portion is greater than the second thickness portion.

11. The device method according to claim 10, wherein the liner layer includes TiN at a thickness of about 100 Å~200 Å.

12. The device according to claim 10, wherein the first thickness portion is substantially aligned with a lower width of the upper barrier layer, and the second thickness portion is substantially aligned with an upper width of the lower barrier layer.

13. The device according to claim 10, further comprising a trench in the insulating base layer between the conductive columns.

14. The device according to claim 13, wherein a sidewall of the lower barrier layer and a sidewall of the trench are substantially coplanar.

15. The device according to claim 10, wherein each of the conductive layers include Al—Cu.

16. The device according to claim 10, wherein the lower and upper barrier layers each includes at least one of TiN and Ti.

* * * * *